United States Patent [19]
Vakhshoori

[11] Patent Number: 5,426,657
[45] Date of Patent: Jun. 20, 1995

[54] ARTICLE COMPRISING A FOCUSING SEMICONDUCTOR LASER

[75] Inventor: Daryoosh Vakhshoori, Scotch Plains, N.J.

[73] Assignee: AT&T Corp., Murray Hill, N.J.

[21] Appl. No.: 250,311

[22] Filed: May 27, 1994

Related U.S. Application Data

[63] Continuation of Ser. No. 26,375, Mar. 4, 1993, abandoned.

[51] Int. Cl.[6] ...................... H01S 3/1055; H01S 3/085
[52] U.S. Cl. ........................................ 372/45; 372/50; 372/99; 372/102; 372/101
[58] Field of Search ................... 372/92, 99, 101, 102, 372/107, 108, 45, 50, 20

[56] References Cited

U.S. PATENT DOCUMENTS

| | | | |
|---|---|---|---|
| 4,218,655 | 6/1993 | Mizrahi | 385/37 X |
| 4,935,939 | 6/1990 | Liau et al. | 372/101 X |
| 5,073,041 | 12/1991 | Rastani | 372/101 X |
| 5,132,843 | 7/1992 | Aoyama et al. | 385/37 X |
| 5,181,220 | 1/1993 | Yagi | 372/45 |
| 5,301,201 | 4/1994 | Dutta et al. | 372/43 |

OTHER PUBLICATIONS

"High-power coherently coupled 8×8 vertical cavity surface emitting laser array", by R. A. Morgan et al., *Applied Physics Letters,* vol. 61, Sep. 7, 1992, pp. 1160–1162.

Erdogan et al, "Circularly Symmetric Operation of a Concentric Circle-grating, Surface Emitting, Laser", Appl. Phys. Lett., vol. 60, No. 16, 4/1992, pp. 1921–1923.

*Primary Examiner*—Rodney B. Bovernick
*Assistant Examiner*—Hemang Sanghavi
*Attorney, Agent, or Firm*—Eugen E. Pacher

[57] ABSTRACT

Disclosed is a laser, to be referred to as a "Z-laser", which comprises means that can ensure excitation of a laser mode that has a far field pattern that comes substantially to a focus at a point external to the laser. Typically, a Z-laser is a vertical cavity surface emitting laser (VCSEL) that comprises an appropriately patterned top surface. Exemplarily, appropriately spaced circular concentric features ("trenches") are formed in the surface. Lasers according to the invention can be advantageously used in variety of applications, e.g., as pump lasers in an optically amplified optical fiber communication system.

9 Claims, 3 Drawing Sheets

ARTICLE COMPRISING A FOCUSING SEMICONDUCTOR LASER

This application is a continuation application Ser. No. 08/026,375, filed on Mar. 4, 1993, now abandoned.

FIELD OF THE INVENTION

This invention pertains to articles (e.g., an optical data processing system or an optical fiber communication system) that comprise a semiconductor laser, typically a vertical cavity surface emitting semiconductor laser (VCSEL), and means for producing a focused radiation output of the laser.

BACKGROUND OF THE INVENTION

VCSELs have recently generated considerable interest, due to their potential for high output power and spatial coherence. See, for instance, R. A. Morgan et al., *Applied Physics Letters*, Vol. 61, p. 1160 (1992). The spatial coherence typically is required for applications that involve beam focusing (e.g., pump laser for a fiber amplifier) and/or beam steering.

Beam focusing is a frequently present feature of articles that comprise a semiconductor laser which, up to now, has required provision of an appropriate separate focusing element, typically a lens. This is an obvious disadvantage, entailing additional cost and complexity, including an alignment step. Thus, it would be desirable to have available a semiconductor laser having a focused output. This application discloses such a laser, to be referred to as a "zone" laser or "Z-laser".

THE INVENTION

In a broad aspect the invention is embodied in an article that comprises a laser, the laser comprising integral means that cause the laser to have a radiation output that substantially comes to a focus at a point external to the laser.

The output beam of a laser "comes substantially to a focus" herein if the output beam is a converging beam, with a minimum cross section at some distance (the focal distance) from the laser.

More specifically, the laser comprises a semiconductor layer structure that comprises first and second reflection means and an active region between said first and second reflection means. The laser further comprises contact means that facilitate flowing on electric current through said layer structure such that the laser has a radiation output. Significantly, the laser comprises means, integral to the laser, that cause the laser to have a radiation output that substantially comes to a focus at a point external to the laser.

Exemplarily, the laser is a VCSEL, each of the first and second reflection means comprises a multiplicity of semiconductor layers, the layer structure has a surface that is substantially parallel with the semiconductor layers, and the radiation is emitted through the surface. The laser comprises means, integral to the laser, that provide a spatial variation of the reflectivity and/or gain/loss associated with the laser, with the variation selected such that the most easily excited transverse laser mode is a mode that has a far field pattern that focuses at some distance from the laser aperture. Exemplarily these means comprise a multiplicity of essentially concentric circular features in or on the surface. In currently preferred embodiments the features are appropriately spaced "trenches" that provide localized change in the reflectivity associated with the laser cavity. The resulting transverse laser mode typically has a field distribution inside the laser that resembles the field distribution that results when a plane wave has passed through a convex lens or a Fresnel zone plate. As will be apparent to those skilled in the art, provision of a spatial variation of the gain/loss associated with the laser requires that the means that provide the variation are disposed within the laser cavity.

The above theoretical description was provided for pedagogic reasons and is not intended to limit the scope of the invention.

Articles according to the invention optionally comprise means for utilizing the radiation output of the laser. Exemplarily, such an article is an optical fiber communication system that comprises an optical amplifier, with the radiation output of the laser being the pump radiation, the output focused onto an optical fiber such that the radiation is launched into the fiber.

Figure 1:
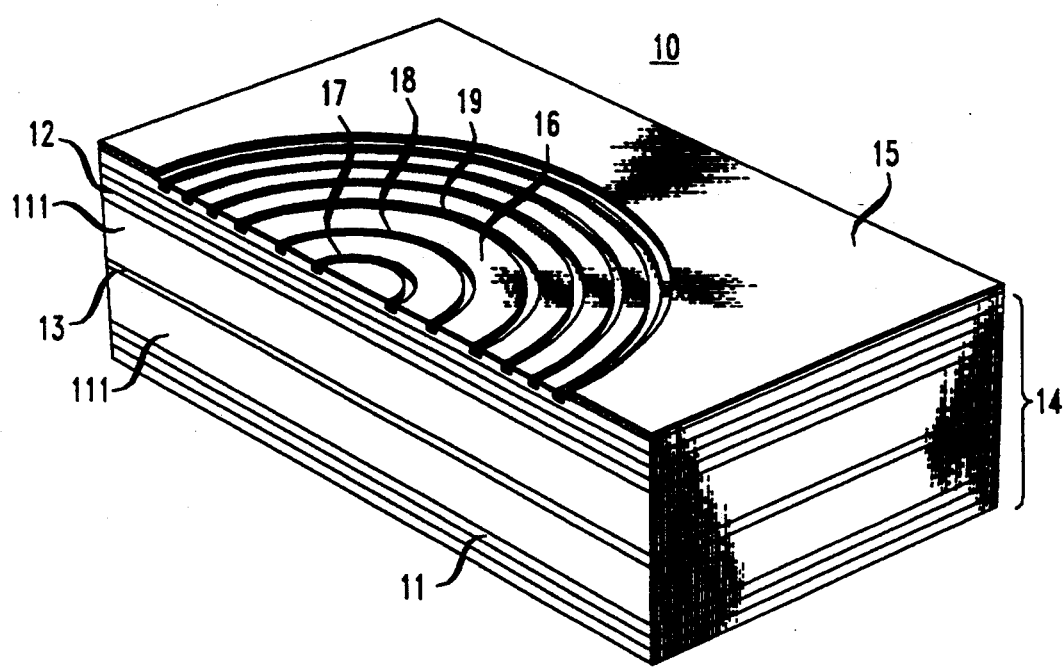
FIGS. 1 and 2 schematically depict an exemplary VCSEL according to the invention, a Z-laser.

FIG. 1 schematically depicts a portion of an exemplary embodiment of the invention. For simplicity's sake, not all layers are shown. VCSEL 10 comprises semiconductor layer structure 14 which comprises multilayer first and second mirrors 11 and 12, respectively, cladding layers 111, and active region 13. On the top surface of the layer structure is situated contact layer 15. Second contact means (not shown) can be conventional. A (typically circular) window in the contact layer facilitates radiation emission from the top surface 16 of the semiconductor layer structure, and a multiplicity of trench-like features (17, 18, 19 . . . .) are present in the surface. Desirably, the "trenches" are circular and concentric, with the radii chosen such that the surface regions substantially correspond to Fresnel zones, schematically indicated by alternating plus and minus signs. The separation of the trenches exemplarily is selected such that the phases associated with the optical paths from the center of adjacent zones to the focal point differ by $n\pi$, where $n = 1, 3, 5$ . . . . Typically, $n = 1$. Other separation schemes can also be used, as those skilled in the art will appreciate.

Figure 2:
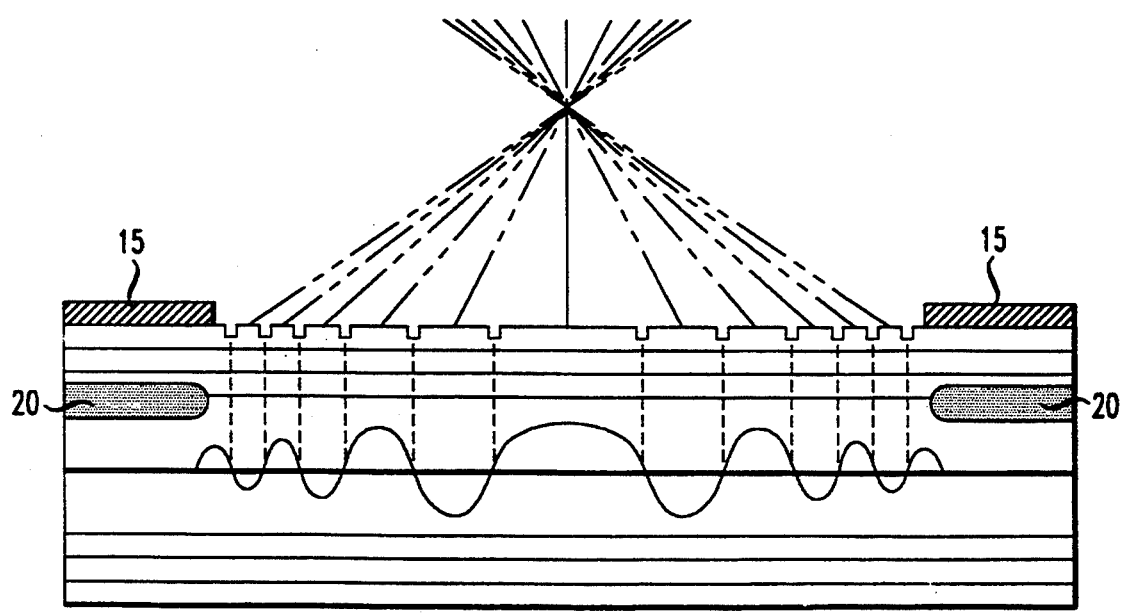

I currently believe that, in a structure as shown in FIG. 1, the trenches affect the reflectivity such that the transverse laser mode which has the lowest intensity at the trench sites has the least loss, and thus will be the lasing mode. The resulting field profile is schematically indicated in FIG. 2. Reference numeral 20 refers to a proton implanted region that serves to define the lasing region in the xy-plane (radiation emission is in the z-direction). The above explanation is offered for tutorial purposes only, and the scope of the invention does not depend on the correctness of the explanation.

A laser according to the invention can be made by any process that is suitable for laser manufacture. Exemplarily, a laser of the type shown in FIGS. 1 and 2 was produced as follows. On a conventional n+ GaAs substrate ($10^{18}$ cm$^{-3}$ Si) was grown by conventional MBE at about 600° C. a layer structure comprising, in sequence, a 0.5 μm n+ GaAs buffer layer ($2 \times 10^{18}$ cm$^{-3}$ Si), a n+ AlGaAs lower mirror ($2 \times 10^{18}$ cm$^{-3}$ Si), a 80 nm n- Al$_{0.16}$Ga$_{0.84}$As lower cladding layer ($10^{17}$ cm$^{-3}$ Si), an essentially undoped active region, a 80 nm p- Al$_{0.16}$Ga$_{0.84}$As upper cladding layer ($5 \times 10^{17}$ cm$^{-3}$ Be), a p-type AlGaAs upper mirror, and a 5 nm p++ GaAs cap layer ($2 \times 10^{19}$ cm$^{-3}$ Be). The lower mirror consisted of 30 pairs of layers, the layer thicknesses selected such that the optical thickness of each pair was $\lambda/2$, where $\lambda$ is the wavelength of the laser light. A pair consisted of a layer of Al$_{0.56}$Ga$_{0.44}$As, followed by a layer of AlAs, followed by a layer of Al$_{0.56}$Ga$_{0.44}$As, which in turn was followed by a layer of Al$_{0.16}$Ga$_{0.84}$As. The upper mirror was identical to the lower mirror, except that it contained only 20 pairs of layers, with the first two pairs being doped with $2 \times 10^{18}$ cm$^{-3}$ Be, the next 14 pairs being doped with $5 \times 10^{18}$ cm$^{-3}$ Be, and the last four pairs with $2 \times 10^{19}$ cm$^{-3}$ Be. The active region contained five 7 nm GaAs quantum wells, with a 7 nm Al$_{0.16}$Ga$_{0.84}$As barrier layer between successive quantum wells.

Conventional photolithography and reactive ion etching were used to form several sets of concentric circular trench-like features (approximately 1 μm wide, 0.35 μm deep) in the top of the layer structure. The spacing between "trenches" was selected according to the previously recited condition for a wavelength of 0.85 μm. In a particular Z-laser the diameter of the outermost trench was about 120 μm. Conventional photolithography and evaporation were used to form a 150 nm gold layer, with circular apertures surrounding the respective sets of trenches, followed by deposition of a 15 nm Au layer onto all of the surface, including apertures. Care was taken to insure that the 15 nm layer was continuous across the trenches. This exemplarily was achieved by the use of off-axis evaporation sources. Patterned photoresist was used as mask for proton implantation (300 keV, resulting in 2.3 μm depth of the implant) to define the active region of the respective lasers. Conventional oxygen implantation was used to isolate the lasers. (In other cases the wafers were cleaved, resulting in individual lasers or arrays or lasers.) After conventionally polishing the back side of the substrate, contact metal (AuGe/Ni/Au) was deposited to provide an ohmic contact, and the lasers were tested.

Figure 3:
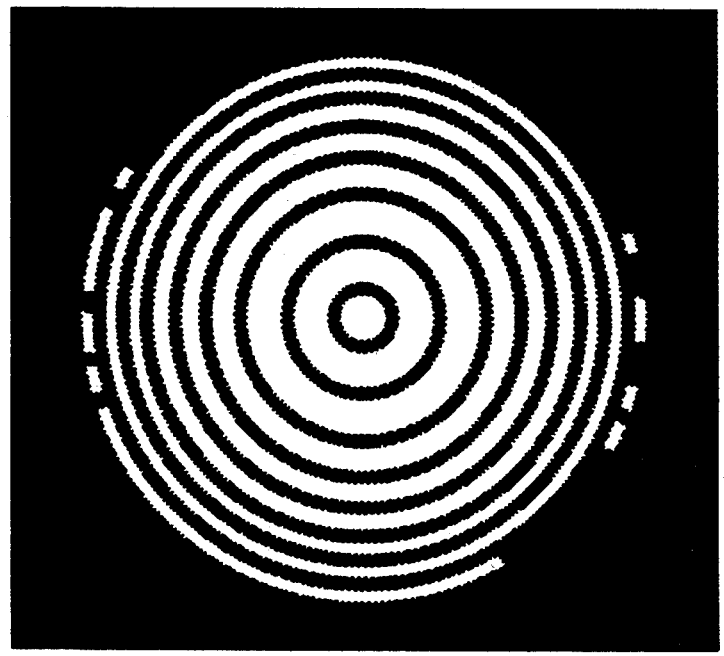
FIGS. 3, 4 and 5 respectively show the near field pattern, far field pattern and output spectrum of an exemplary Z-laser.
Figure 4:
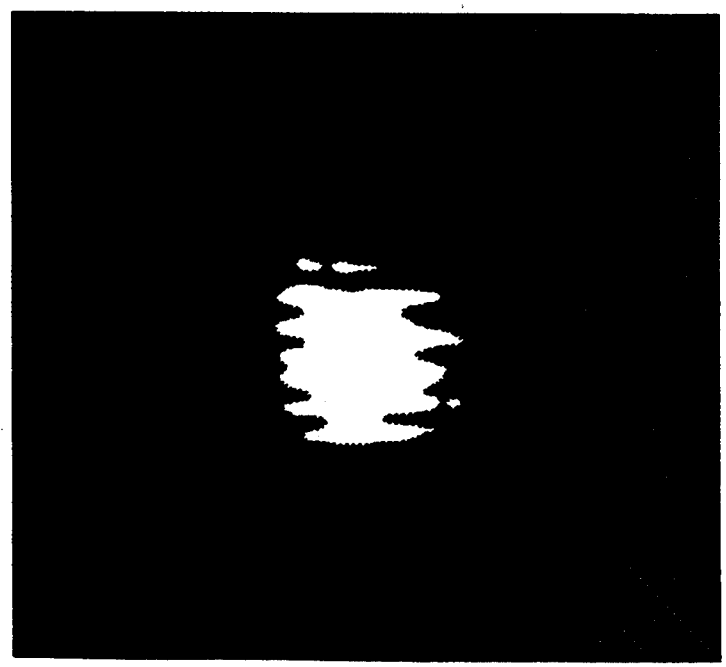
Figure 5:
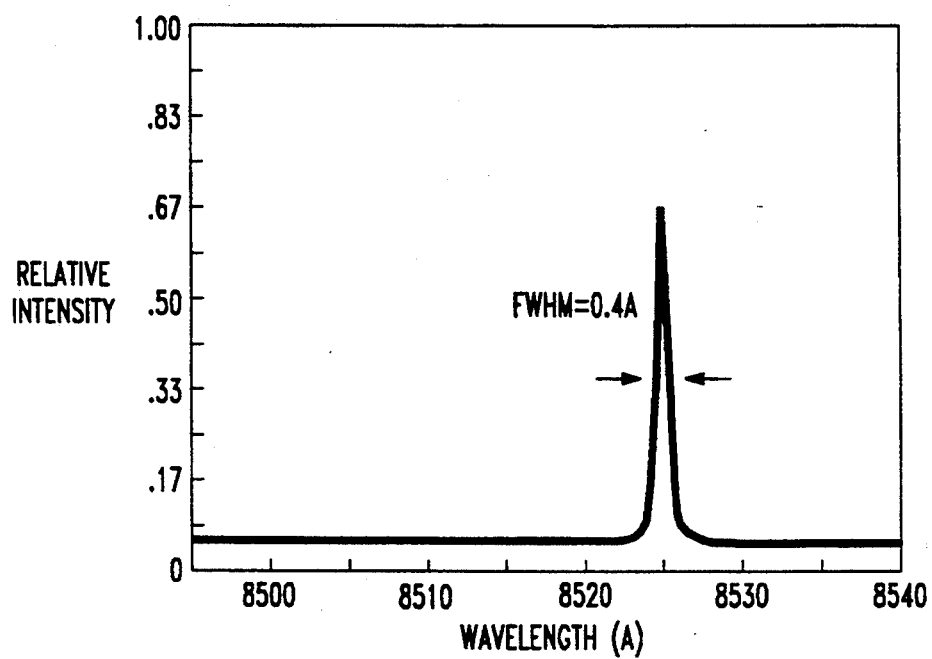

Exemplarily, a thus produced laser with 120 μm diameter aperture had a pulsed threshold current of 250 mA (1.8 kA/cm$^2$). The near field and far field beam patterns (both at twice the threshold current) are shown in FIGS. 3 and 4, respectively. Although the far field focal spot diameter was about 17 μm (about three times the diffraction limit), the far field focal spot clearly indicates the coherence of the beam. The laser spectrum is shown in FIG. 5. The laser linewidth as spectrometer-limited. The output power of the laser exceeded 200 mW.

Those skilled in the art will appreciate the invention can be embodied in a variety of VCSELs, including other than GaAs-based VCSELs (e.g., InP-based lasers), and in arrays of VCSELs, and all such embodiments are contemplated. Furthermore, the invention is not limited to the use of trenches as described, and all means that can locally alter the reflectivity and/or gain/loss associated with the laser cavity are contemplated.

Figure 6:
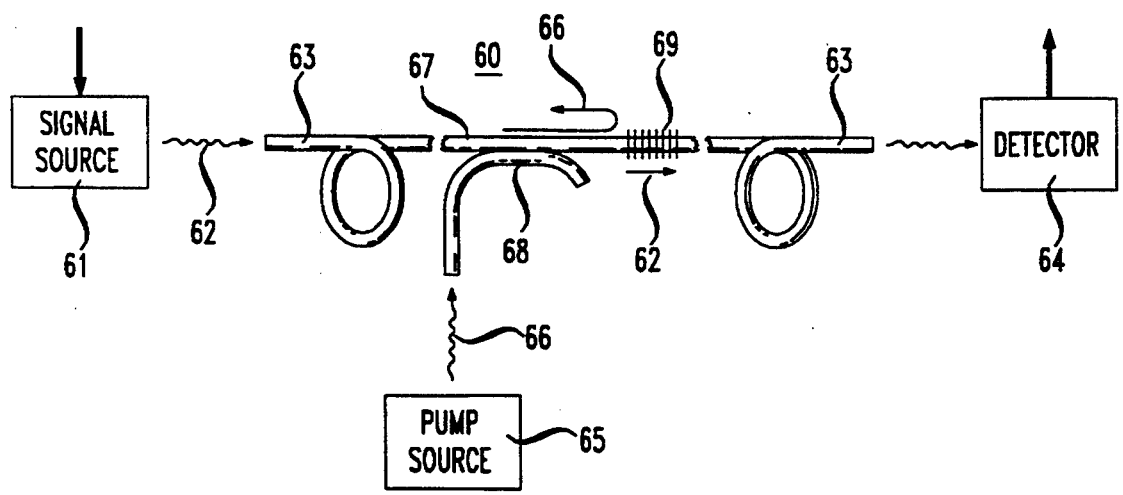
FIG. 6 shows schematically an exemplary article according to the invention, namely, an optical fiber communication system that comprises a Z-laser. No attempt has been made to accurately display dimensions and/or proportions.

FIG. 6 schematically depicts an exemplary article according to the invention, an optically amplified fiber communication system 60. Signal source 61 emits radiation 62 in response to an external signal. The radiation propagates through optical fiber (e.g., 63) to detector 64. Between source and detector is an optical amplifier which comprises pump laser 65, means 68 for coupling pump radiation 66 into amplifier fiber 67. Optionally the fiber transmission path between source and detector comprises grating means 69 which reflect pump radiation and pass signal radiation. Laser 65 exemplarily is a Z-laser that focuses pump radiation of wavelength 980 nm onto an end face of an optical fiber.

I claim:

1. An article comprising a vertical cavity surface emitting laser, the laser comprising a semiconductor layer structure that comprises first and second reflectors that define a laser cavity, and further comprises an active region between, and parallel with, said first and second reflectors, the laser further comprising contact means that facilitate flowing an electric current through the layer structure such that the laser has a radiation output; wherein the laser comprises substantially circular, concentric spaced apart features selected to provide
   i) localized variations in a reflectivity of at least one of said reflectors; or
   ii) localized variations in a gain/loss of the laser; or
   iii) localized variations in both the reflectivity of at least one of said reflectors and localized variations in the gain/loss of the laser;
   wherein the spacing between said localized variations is not constant in a radial direction, and said localized variations are effective for causing the laser to laser in a higher order transverse mode such that said radiation output of the laser comes substantially to a focus at a point that is spaced from the laser, without passage through focusing means that are spaced from said laser cavity and from said reflectors that define the laser cavity.

2. An article according to claim 1, wherein each of said first and second reflection means comprises a multiplicity of semiconductor layers, wherein said layer structure is disposed on a semiconductor substrate and has a surface that is substantially parallel with said semiconductor layers and is spaced from the substrate, said surface comprising said substantially circular features, said features providing said localized variations in the reflectivity.

3. An article according to claim 2, wherein said substantially circular features comprise recessed portions of said surface.

4. An article according to claim 3, wherein each said substantially circular feature comprises a circular trench-like recess in said surface, with all said recesses being of substantially the same width.

5. An article according to claim 2, wherein the radiation output is emitted through said surface.

6. An article according to claim 1, wherein each of said first and second reflection means comprises a multiplicity of semiconductor layers, wherein said layer structure is disposed on a semiconductor substrate and has a surface that is substantially parallel with said semiconductor layers and is spaced from the substrate, wherein said substantially circular features are disposed inside the laser cavity, said features providing said localized variations in the gain/loss.

7. An article according to claim 1, wherein the article is an optical communication system that comprises a signal radiation source and a detector, with optical fiber-signal-transmissively connecting said source and detector, with optical fiber amplifier means intermediate said source and detector and comprising a source of pump radiation and means for coupling said pump radiation into said optical fiber, wherein said source of pump radiation comprises said laser.

8. An article according to claim 1, wherein the article comprises a multiplicity of lasers on a common substrate.

9. An article according to claim 1, wherein the spacing between said localized variations is selected such that a phase associated with an optical path from the center of a given localized variation to the focal point differs by $n\pi$ from a phase associated with an optical path from the center of a localized variation that is adjacent to the given variation to the focal point, where $n = 1, 3, 5, \ldots$.

* * * * *